United States Patent
Hsu et al.

(10) Patent No.: US 11,804,434 B2
(45) Date of Patent: Oct. 31, 2023

(54) INTEGRATED CIRCUIT APPARATUS AND POWER DISTRIBUTION NETWORK THEREOF

(71) Applicant: REALTEK SEMICONDUCTOR CORP., Hsinchu (TW)

(72) Inventors: Chan-Wei Hsu, Hsinchu (TW); Chih-Wei Lin, Hsinchu (TW); Yun-Chih Chang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 373 days.

(21) Appl. No.: 17/136,264

(22) Filed: Dec. 29, 2020

(65) Prior Publication Data

US 2021/0296235 A1 Sep. 23, 2021

(30) Foreign Application Priority Data

Mar. 17, 2020 (TW) ................................. 109108694

(51) Int. Cl.
| | |
|---|---|
| *H03K 19/173* | (2006.01) |
| *H01L 25/00* | (2006.01) |
| *H01L 23/50* | (2006.01) |
| *H01L 23/522* | (2006.01) |
| *H01L 23/528* | (2006.01) |

(52) U.S. Cl.
CPC ...... *H01L 23/5286* (2013.01); *H01L 23/5226* (2013.01)

(58) Field of Classification Search
CPC .................. H01L 23/5226; H01L 23/5286
See application file for complete search history.

(56) References Cited

U.S. PATENT DOCUMENTS

| | | | | |
|---|---|---|---|---|
| 9,166,594 B2* | 10/2015 | Parks | .................. | H03K 19/1732 |
| 9,577,640 B1* | 2/2017 | Park | .................. | H03K 19/1732 |
| 2016/0260660 A1* | 9/2016 | Lin | .................. | H01L 23/49844 |
| 2020/0042668 A1* | 2/2020 | Peng | .................. | H01L 23/535 |

* cited by examiner

*Primary Examiner* — Anthony Ho
*Assistant Examiner* — David J Goodwin
(74) *Attorney, Agent, or Firm* — Li & Cai Intellectual Property (USA) Office

(57) ABSTRACT

An integrated circuit apparatus and a power distribution network thereof are provided. The power distribution network includes a top wiring layer, a bottom wiring layer, and a first conductive path. The top wiring layer includes a first top trace and a second top trace extending along a first direction. The bottom wiring layer includes a first bottom trace extending along a second direction. The first bottom trace has an electric potential equal to that of the first top trace, but different from that of the second top trace. The first conductive path connected between the first top and bottom traces includes a first upper conductive structure and a first lower conductive structure that are located directly under the first top trace and the second top trace, respectively. A signal wire preselected region is defined between the first upper conductive structure and the first bottom trace.

20 Claims, 10 Drawing Sheets

INTEGRATED CIRCUIT APPARATUS AND POWER DISTRIBUTION NETWORK THEREOF

CROSS-REFERENCE TO RELATED PATENT APPLICATION

This application claims the benefit of priority to Taiwan Patent Application No. 109108694, filed on Mar. 17, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic apparatus and a power distribution network thereof, and more particularly to an integrated circuit apparatus and a power distribution network thereof.

BACKGROUND OF THE DISCLOSURE

A conventional integrated circuit apparatus includes a plurality of standard cells respectively with different functions. Each of the standard cells may include a plurality of transistors and connection structures so as to perform basic logic operations. The standard cells are electrically connected to one another through a plurality of signal interconnection wires.

Furthermore, the conventional integrated circuit apparatus usually includes a plurality of power rails and a plurality of ground rails. Each of the power rails (or the ground rails) is connected to the corresponding standard cells so as to supply power thereto. The conventional integrated apparatus further includes a stacked structure, and the stacked structure includes a plurality of conductive layers and a plurality of insulating layers alternately stacked above the power rails and the ground rails. The topmost conductive layer includes a plurality of power lines and a plurality of ground lines, and an extending direction of each of the power and ground lines intersects with an extending direction of each of the power and ground rails.

Each of the power lines can be electrically connected to the corresponding power rails through a plurality of power conductive vias, and the power conductive vias pass through the stacked structure and are respectively located at a plurality of overlapping regions defined between each of the power lines and the corresponding power rails. Similarly, each of the ground lines can be electrically connected to the corresponding ground rails through a plurality of ground conductive vias, and the ground conductive vias pass through the stacked structure and are respectively located at a plurality of overlapping regions defined between each of the ground lines and the corresponding ground rails.

In the stacked structure, other areas where neither the power conductive vias nor the ground conductive vias are arranged can be used to arrange the signal interconnection wires, so that signal communications among the standard cells can be established. Since the power and ground conductive vias are located directly under the corresponding power and ground lines, respectively, the arrangements of the signal interconnection wires in the stacked structure have to avoid the areas occupied by the power and ground conductive vias.

Generally, when the numbers of the power and ground lines are increased, a decrease of the power integrity due to the voltage drop can be prevented, in which the voltage drop may result in insufficient power supply for the standard cells. However, as the numbers of the power and ground lines increase, the areas occupied by the power and ground conductive vias will also increase. As such, the areas for arranging the signal interconnection wires would be restricted. Accordingly, under a situation where the numbers of the power and ground lines are not decreased so as to maintain the power integrity, how the zones for arranging the signal interconnection wires can be increased is still one of the important issues to be solved in this industry.

SUMMARY OF THE DISCLOSURE

In response to the above-referenced technical inadequacies, the present disclosure provides an integrated circuit apparatus and a power distribution network thereof, so as to increase a space for arranging signal interconnection wires without decreasing the numbers of the power and ground lines.

In one aspect, the present disclosure provides an integrated circuit apparatus including a plurality of standard cells and a power distribution network. The power distribution network is electrically connected to the standard cells and includes a top wiring layer, a bottom wiring layer, and a first conductive path. The top wiring layer includes a first top trace and a second top trace that are adjacent to each other and extend along a first direction. The bottom wiring includes a first bottom trace that extends along a second direction, in which the first bottom trace has an electric potential that is equal to that of the first top trace but different from that of the second top trace. The first conductive path is connected between the first top trace and the first bottom trace and includes a first upper conductive structure and a first lower conductive structure. The first upper conductive structure is located directly under the first top trace, and the first lower conductive structure is located directly under the second top trace. The first upper conductive structure and the first bottom trace jointly define a signal wire preselected region therebetween.

In another aspect, the present disclosure provides a power distribution network including a top wiring layer, a bottom wiring layer, and a first conductive path. The top wiring layer includes a first top trace and a second top trace that are adjacent to each other and both extend along a first direction. The bottom wiring includes a first bottom trace that extends along a second direction, in which the first bottom trace has an electric potential that is equal to that of the first top trace but different from that of the second top trace. The first conductive path is connected between the first top trace and the first bottom trace and at least includes a first upper conductive structure and a first lower conductive structure. The first upper conductive structure is located directly under the first top trace, and the first lower conductive structure is located directly under the second top trace. The first upper conductive structure and the first bottom trace jointly define a signal wire preselected region therebetween.

Therefore, in the integrated circuit apparatus and the power distribution network thereof provided in the present disclosure, by virtue of "the first upper conductive structure being located directly under the first top trace," "the first lower conductive structure being located directly under the second top trace" and "the first conductive structure and the first bottom trace jointly defining a signal wire preselected region therebetween," the range covered by the signal wire preselected region can be enlarged without compromising the power integrity.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
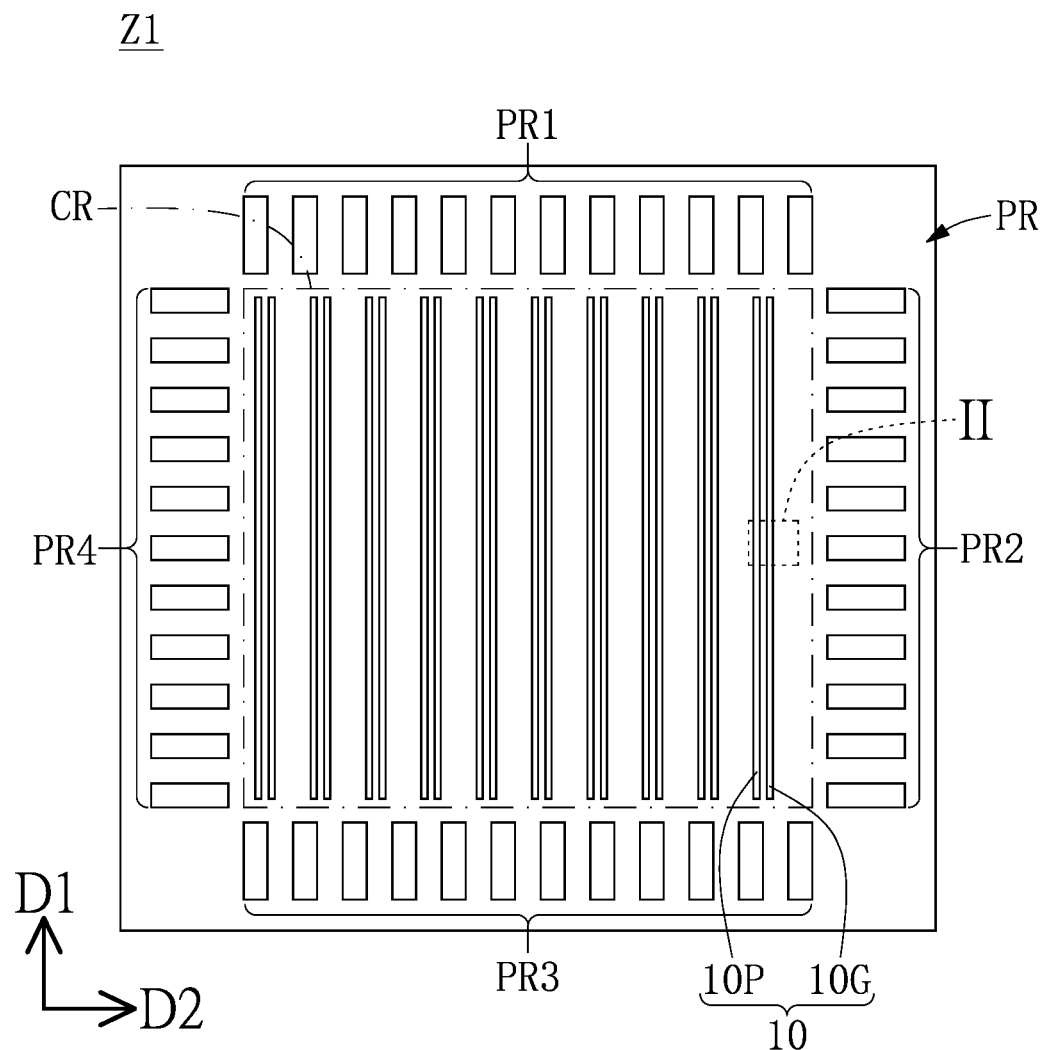
FIG. 1 is a top schematic view of an integrated circuit apparatus according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
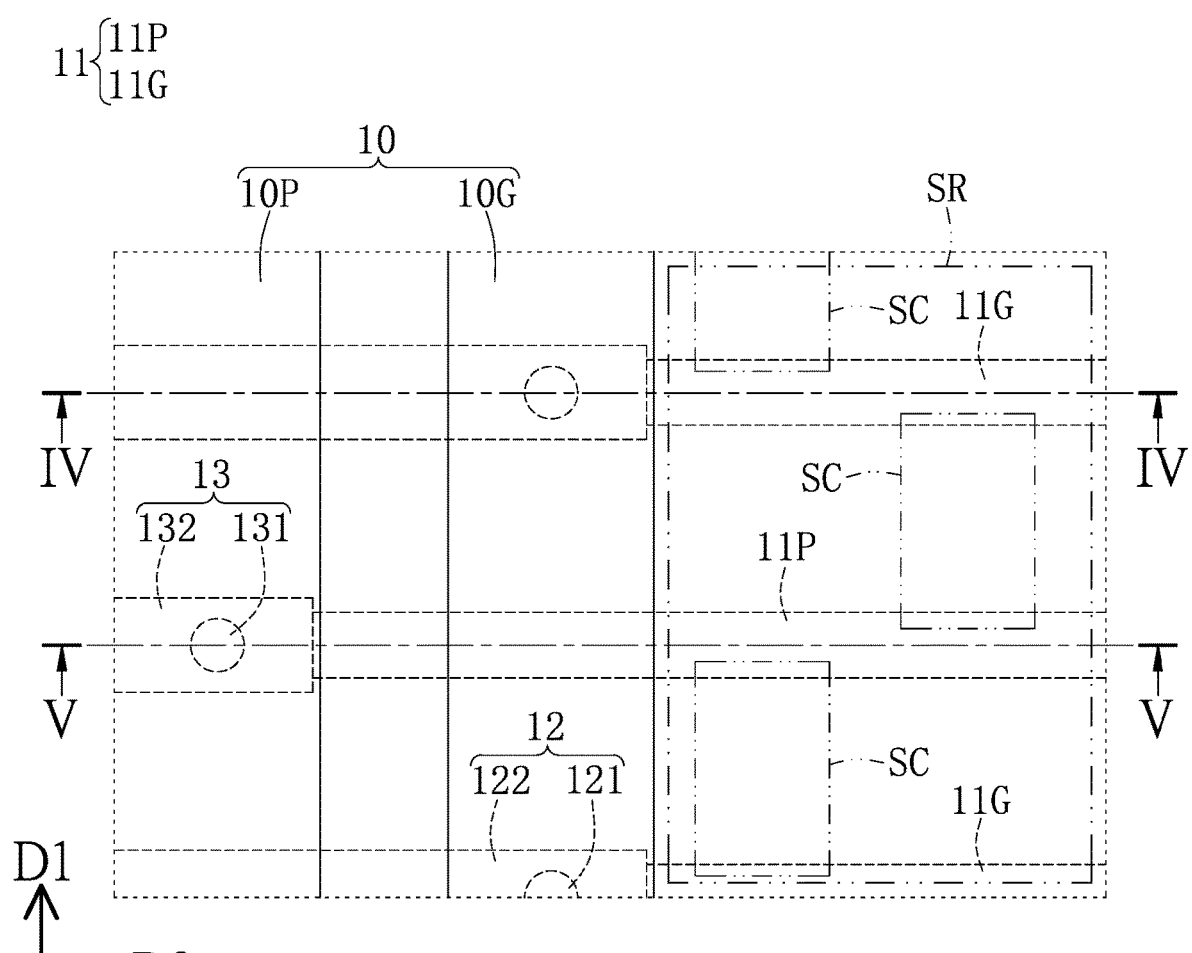
FIG. 2 is an enlarged view of part II shown in FIG. 1.
Figure 3:
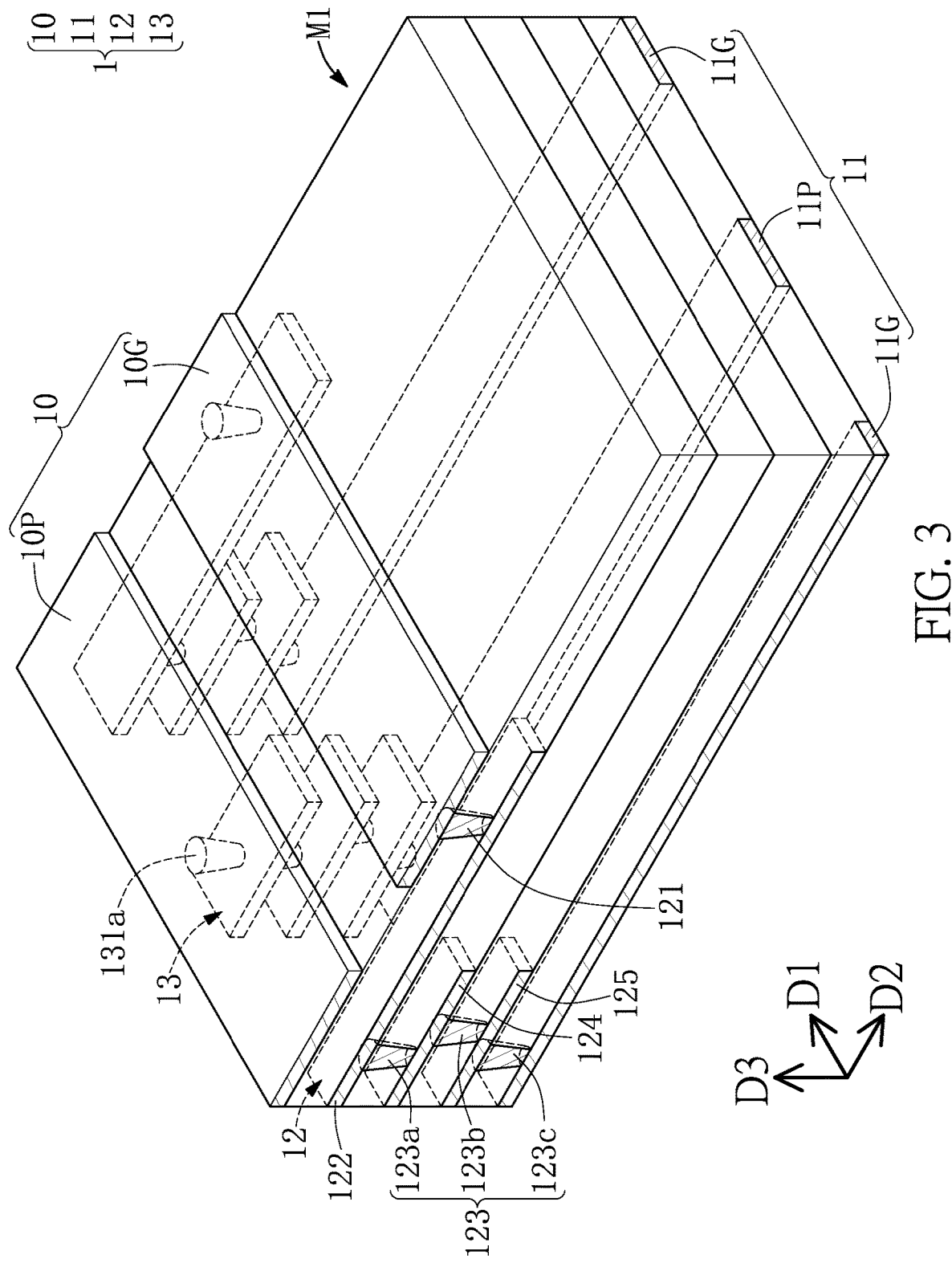
FIG. 3 is a perspective schematic view showing a part of a laminated structure of the integrated circuit apparatus shown in FIG. 2.

Reference is made to FIG. 1 to FIG. 3. FIG. 1 is a top schematic view of an integrated circuit apparatus according to a first embodiment of the present disclosure. FIG. 2 is an enlarged view of part II shown in FIG. 1. FIG. 3 is a perspective schematic view showing a part of a laminated structure of the integrated circuit apparatus shown in FIG. 2.

In the first embodiment of the present disclosure, an integrated circuit apparatus Z1 is provided. As shown in FIG. 1, the integrated circuit apparatus Z1 has a core region CR and a pad arrangement region PR surrounding the core region CR. The integrated circuit apparatus Z1 includes a plurality of solder pads PR1-PR4 that are arranged in the pad arrangement region PR. The number and arrangements of the solder pads PR1-PR4 shown in FIG. 1 are exemplified for description, and the present disclosure is not limited thereto.

The solder pads PR1-PR4 are arranged to surround the core region CR and can be designated to different signal terminals, such as a VCC terminal, a VDD terminal, a VSS terminal, a power supply terminal, a clock terminal, an address signal terminal, and so on. The integrated circuit apparatus Z1 can be electrically connected to a printed circuit board or another electronic component through the solder pads PR1-PR4.

Reference is made to FIG. 2 and FIG. 3. Furthermore, the integrated circuit apparatus Z1 includes a plurality of standard cells SC and a power distribution network 1. The standard cells SC and the power distribution network 1 are located in the core region CR.

Each of the standard cells can include a plurality of transistors and connection structures so as to perform basic logic operations. For example, the standard cells SC can be selected from one of logic gates, such as an AND gate, an OR gate, an XOR gate, a NOT gate, a NAND gate, a NOR gate, an XNOR gate, and a combinatorial logic circuit, such as a multiplexer, a flip flop, an adder, or a counter.

As shown in FIG. 2 and FIG. 3, the power distribution network 1 is electrically connected to the standard cells SC so as to supply power to the standard cells SC. To be more specific, as shown in FIG. 3, the integrated circuit apparatus Z1 includes a laminated structure M1 disposed on the standard cells SC. The laminated structure M1 includes a plurality of patterned wiring layers and a plurality of insulating layers (not denoted by any reference numeral) that are alternately stacked, so as to form the power distribution network 1 and a plurality of signal interconnection traces (not shown) for electrical connections among the standard cells SC. The signal interconnection traces can be arranged in a signal wire preselected region SR shown in FIG. 2. However, for ease of description, the signal interconnection traces are omitted in FIG. 2. Furthermore, the number of the patterned wiring layers shown in FIG. 3 is five, but the present disclosure is not limited to the example provided herein.

As shown in FIG. 1 to FIG. 3, the power distribution network 1 includes a top wiring layer 10, a bottom wiring layer 11, a first conductive path 12, and a second conductive path 13.

The top wiring layer 10 is the topmost layer of the laminated structure M1, and the top wiring layer 10 includes a first top trace and a second top trace that extend along a first direction D1. The first top trace has an electric potential different from that of the second top trace. That is to say, when the first top trace is a top ground trace 10G, the second top trace is a top power trace 10P. When the first top trace is a top power trace 10P, the second top trace is a top ground trace 10G. In the instant embodiment, the top ground trace 10G is designated to the first top trace, and the top power trace 10P is designated to the second top trace.

It should be noted that a plurality of top ground traces 10G (the first top traces) and a plurality of top power traces 10P (the second top traces) are shown in FIG. 1, and the top ground traces 10G and the top power traces 10P are arranged in an alternate manner. Furthermore, in the instant embodiment, one of the top ground traces 10G and two adjacent top power traces 10P are arranged in a non-equidistant manner. However, in another embodiment, the top ground traces 10G and the top power traces 10P are arranged to be equidistant from one another, i.e., any two adjacent ones of the top ground traces 10G and the top power traces 10P are spaced apart from each other by the same line pitch. Furthermore, the numbers and the arrangement of the top ground traces 10G and the top power traces 10P shown in FIG. 1 have been simplified for ease of explaining the present disclosure. Accordingly, the numbers and the arrangement of the top ground traces 10G and the top power traces 10P can be adjusted according to particular implementations, and the present disclosure is not limited to the examples provided herein. For the sake of brevity, the arrangements of the standard cells shown in FIG. 2 are merely exemplified. In practical, the standard cells SC may be disposed under the top ground traces 10G or under the top power traces 10P, and the arrangements of the standard cells SC are not limited in the present disclosure.

Reference is made to FIG. 2 and FIG. 3. The bottom wiring layer 11 includes a plurality of first bottom traces and a plurality of second bottom traces that extend along a second direction D2. Each of first bottom traces has an electric potential different from that of each of the second bottom traces. In the instant embodiment, each of bottom ground traces 11G is defined as the first bottom trace, and each of bottom power traces 11P is defined as the second bottom trace. Accordingly, the electric potential of the first bottom trace (the bottom ground trace 11G) is equal to the electric potential of the first top trace (the top ground trace 10G), but different from the electric potential of the second top trace (the top power trace 10P).

Reference is made to FIG. 2. The orthogonal projections of the top ground traces 10G and the top power traces 10P of the top wiring layer 10 intersect with the bottom ground traces 11G (only two are shown in FIG. 2 as an example) and the bottom power traces 11P (only one is shown in FIG. 2 as an example) of the bottom wiring layer 11.

Reference is made to FIG. 3. The first conductive path 12 is connected between one of the top ground traces 10G and one of the bottom ground traces 11G, and the second conductive path 13 is connected between one of the top power traces 10P and one of the bottom power traces 11P. In other words, each of the top ground traces 10G is electrically connected to the corresponding bottom ground traces 11G through the first conductive path 12. Each of the top power traces 10P is electrically connected to the corresponding bottom power trace 11P through the second conductive path 13.

Figure 4:
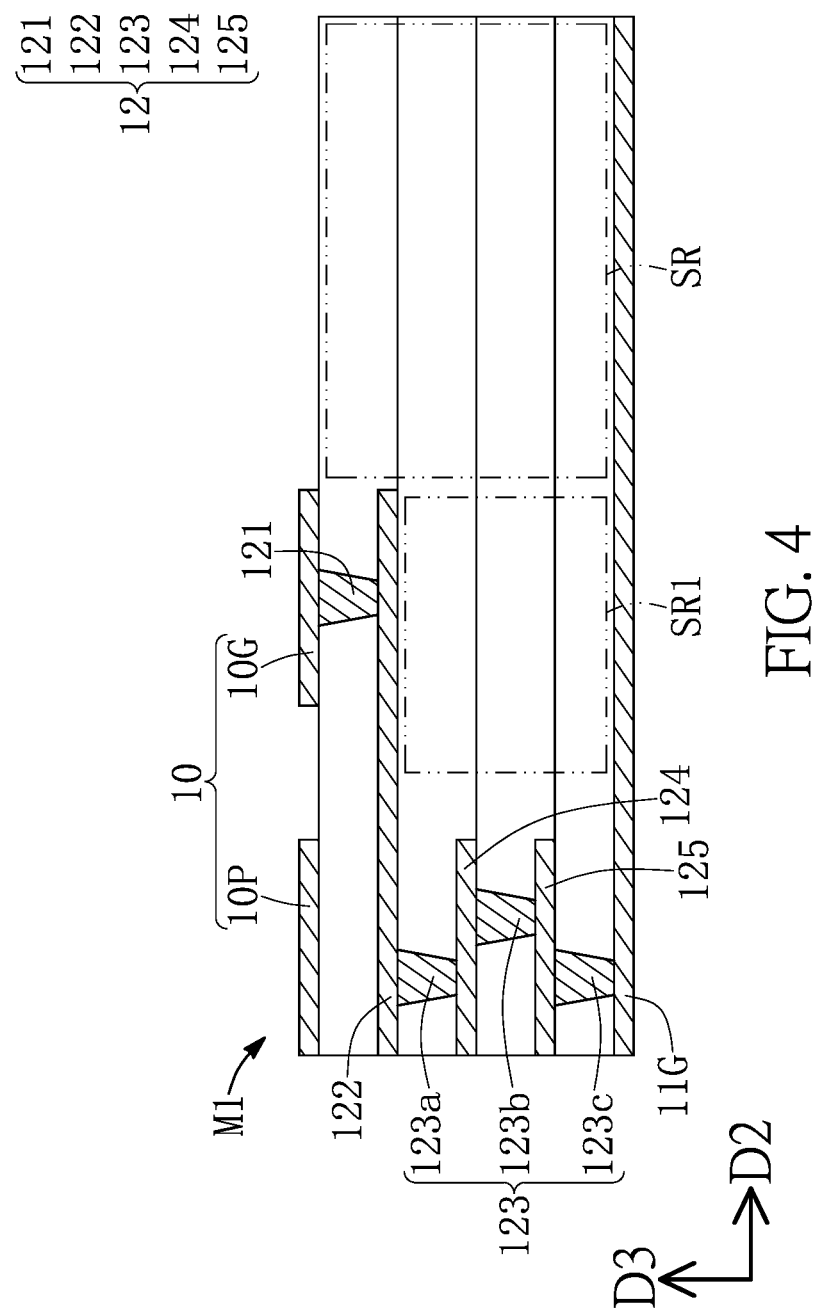
FIG. 4 is a cross-sectional view taken along line IV-IV of FIG. 2.

Reference is made to FIG. 2 to FIG. 4, in which FIG. 4 is a cross-sectional view taken along line IV-IV of FIG. 2. The first conductive path 12 includes at least a first upper conductive structure 121, a first connection wiring layer 122, and a first lower conductive structure 123. The first upper conductive structure 121 is connected between the first connection wiring layer 122 and one of the top ground traces 10G. In the instant embodiment, since the top wiring layer 10 and the first connection wiring layer 122 are spaced apart from each other by an insulating layer, the first upper conductive structure 121 passes through the aforementioned insulating layer and extends from one of the top ground traces 10G to the first connection wiring layer 122.

That is, the first upper conductive structure 121 extends from the top wiring layer 10 to the first connection wiring layer 122. In the instant embodiment, the first upper conductive structure 121 includes at least one conductive via, but the present disclosure is not limited thereto. In another embodiment, the first connection wiring layer 122 and the top wiring layer 10 may be spaced apart from each other by multiple insulating layers. As such, the first upper conductive structure 121 may include a plurality of conductive vias that are connected to one another, so that each of the top ground traces 10G can be electrically connected to the first connection wiring layer 122 through the first upper conductive structure 121. Furthermore, the first upper conductive structure 121 is located directly under one of the top ground traces 10G.

The first connection wiring layer 122 is located between the top wiring layer 10 and the bottom wiring layer 11, and extends along the second direction D2 from a position directly under one of the top ground traces 10G (the first top trace) to another position directly under one of the adjacent top power traces 10P (the second top trace). Accordingly, as shown in FIG. 3 and FIG. 4, the orthogonal projections of the adjacent top ground and power traces 10G, 10P both partially overlap with the first connection wiring layer 122.

The first lower conductive structure 123 is connected between the first connection wiring layer 122 and one of the bottom ground traces 11G. Reference is made to FIG. 3 and FIG. 4. The first connection wiring layer 122 and the bottom wiring layer 11 is spaced apart from each other by multiple insulating layers. Furthermore, the first lower conductive structure 123 includes a plurality of first conductive vias 123a to 123c and the first conductive path 12 further includes a plurality of first interconnection layers 124 and 125 that are respectively located at different height levels. The first conductive vias 123a to 123c respectively pass through different insulating layers so that the first connection wiring layer 122, the first interconnection layers 124 and 125, and the corresponding one of the bottom ground traces 11G are serially connected to one another.

It should be noted that, as shown in FIG. 3 and FIG. 4, in the instant embodiment, the first lower conductive structure 123 is located directly under one of the top power traces 10P, instead of under one of the top ground traces 10G. That is to say, by arranging the first connection wiring layer 122, the first upper conductive structure 121 and the first lower conductive structure 123 of the first conductive path 12 can be located directly under one of the top ground traces 10G (the first top traces) and one of the top power traces 10P (the second top traces) that are adjacent to each other, respectively.

Figure 5:
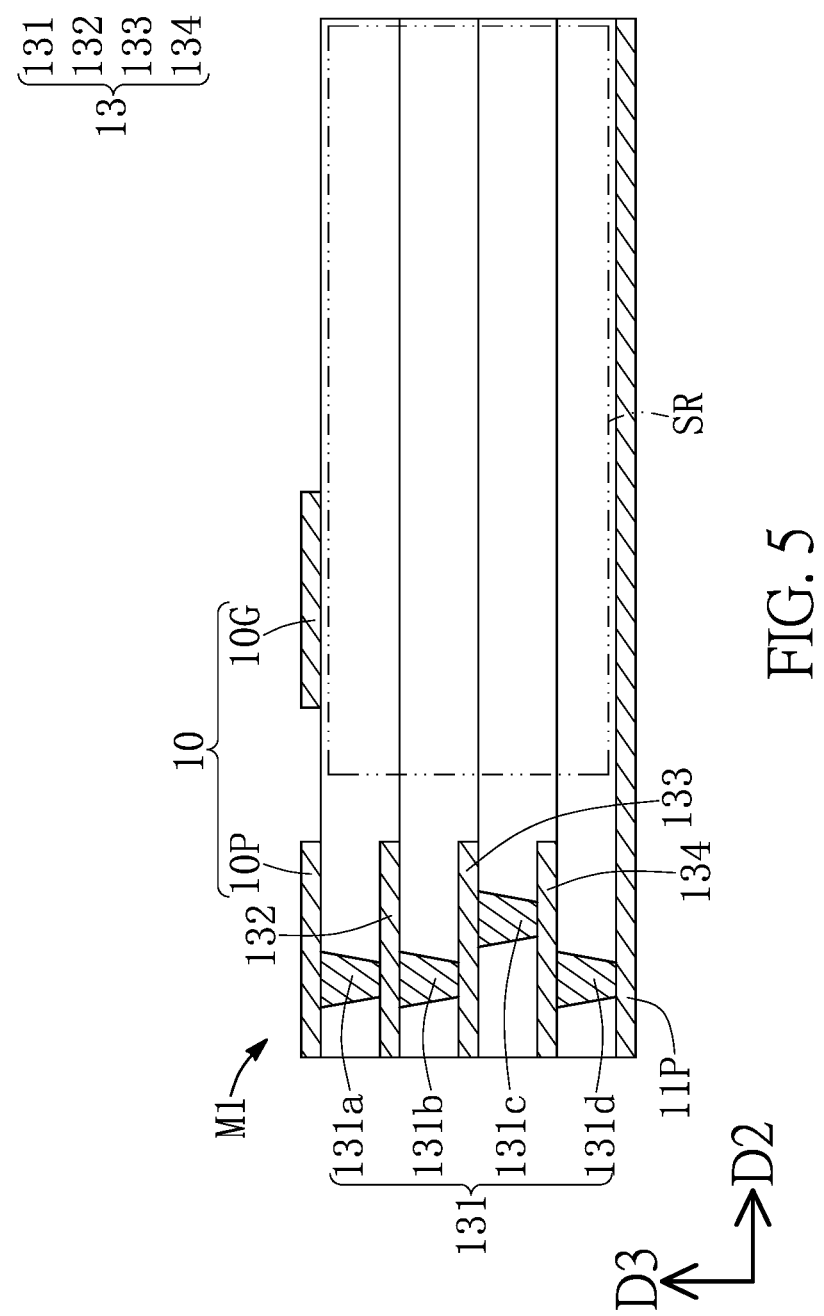
FIG. 5 is a cross-sectional view taken along line V-V of FIG. 2.

Reference is made to FIG. 2, FIG. 3, and FIG. 5, in which FIG. 5 is a cross-sectional view taken along line V-V of FIG. 2. Furthermore, the second conductive path 13 is connected between one of the top power traces 10P and one of the bottom power traces 11P. In other words, each of the top power traces 10P can be electrically connected to the corresponding one of the bottom power traces 11P through the second conductive path 13.

As shown in FIG. 3 and FIG. 5, the second conductive path 13 includes a second conductive structure 131 and a plurality of second interconnection layers 132 to 134 that are respectively located at different height levels. The second conductive structure 131 includes a plurality of second conductive vias 131a to 131d, and the second conductive vias 131a-131d respectively pass through different insulating layers, such that one of the top power traces 10P, the second interconnection layers 132-134, and one of the bottom power traces 11P can be serially connected to one another.

In the instant embodiment, the second interconnection layer 132 and the first connection wiring layer 122 are both located at the same height level and can be fabricated in the same steps. That is to say, under a situation that the top wiring layer 10 is defined as a first-level conductive layer, the first connection wiring layer 122 is a second-level conductive layer that is the closest to the top wiring layer 10, and the first connection wiring layer 122 and the top wiring layer 10 are spaced apart from each other by only one insulating layer. However, in another embodiment, the first connection wiring layer 122 can be a third or fourth-level conductive layer and spaced apart from the top wiring layer 10 by more than one insulating or conductive layer. Under the circumstance, the first upper conductive structure 121 may include a plurality of conductive vias respectively passing through different insulating layers, such that the top ground trace 10G can be electrically connected to the first connection wiring layer 122.

Furthermore, as shown in FIG. 3, the second interconnection layer 133 and the first interconnection layer 124 are located at the same height level and belong to the same conductive layer, and another second interconnection layer 134 and the first interconnection layer 125 are located at the same height level and belong to another conductive layer.

It should be noted that as shown in FIG. 3, in the instant embodiment, the second conductive structure 131 (or the second conductive path 13) and the first lower conductive structure 123 are both located directly under one of the top power traces 10P. That is to say, in the laminated structure M1, the region located directly under the first connection wiring layer 122 and one of the top ground traces 10G is neither occupied by the first conductive path 12 nor the second conductive path 13, so as to allow the signal interconnection traces to be arranged therein.

Reference is made to FIG. 2 to FIG. 5. In the laminated structure M1 of the embodiment of the present disclosure, in addition to the signal wire preselected region SR shown in FIG. 2, another signal wire preselected region SR1 can be defined between the first upper conductive structure 121 (or the first connection wiring layer 122) and one of the bottom ground traces 11G. Accordingly, in the integrated circuit apparatus Z1 of the present disclosure, the region for arranging the signal interconnection traces (i.e., the signal wire preselected regions SR, SR1) can be enlarged under a situation without decreasing the numbers of power and ground traces. That is to say, not only the power integrity of the integrated circuit apparatus Z1 of the present disclosure can be maintained, but the signal wire preselected region SR1 can be additionally increased.

Figure 6:
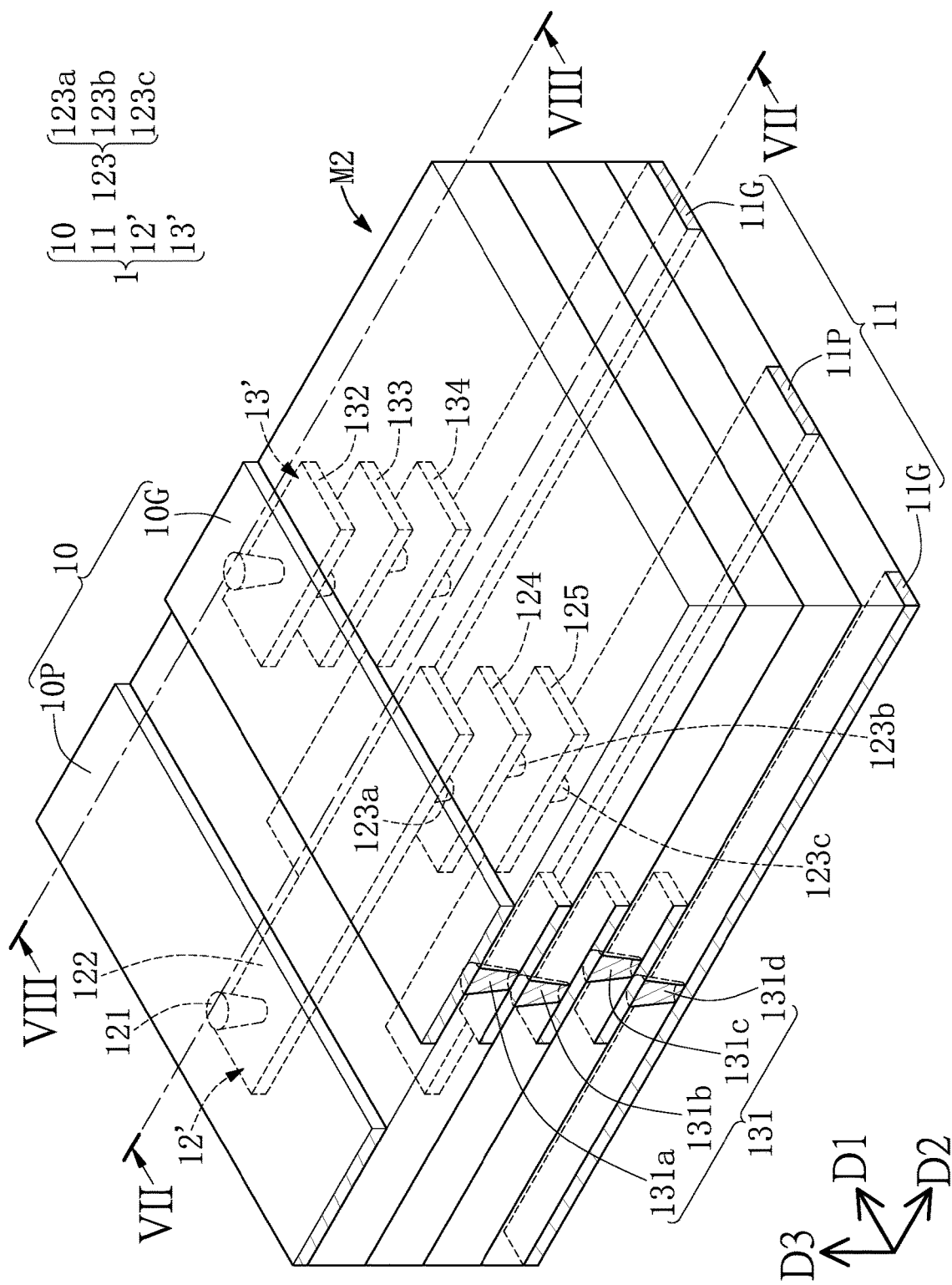
FIG. 6 is a perspective schematic view showing a part of a laminated structure according to another embodiment of the present disclosure.
Figure 7:
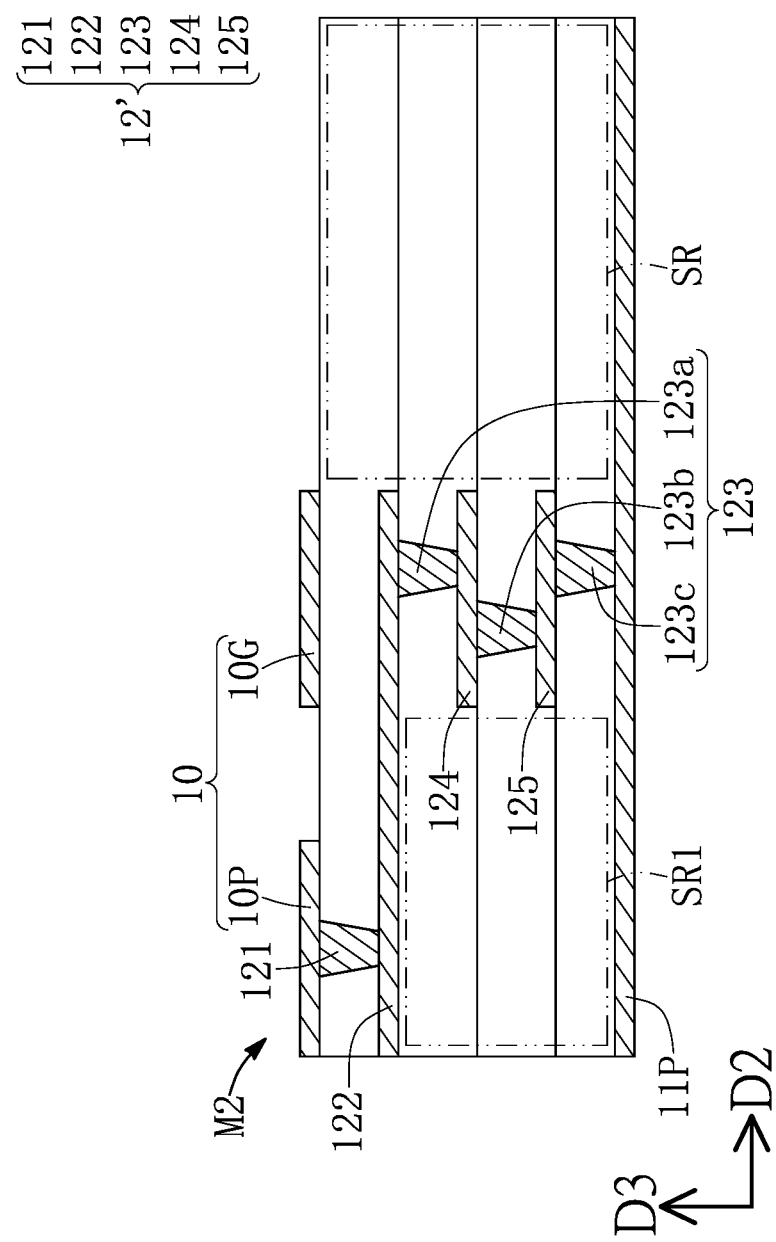
FIG. 7 is a cross-sectional view taken along line VII-VII of FIG. 6.
Figure 8:
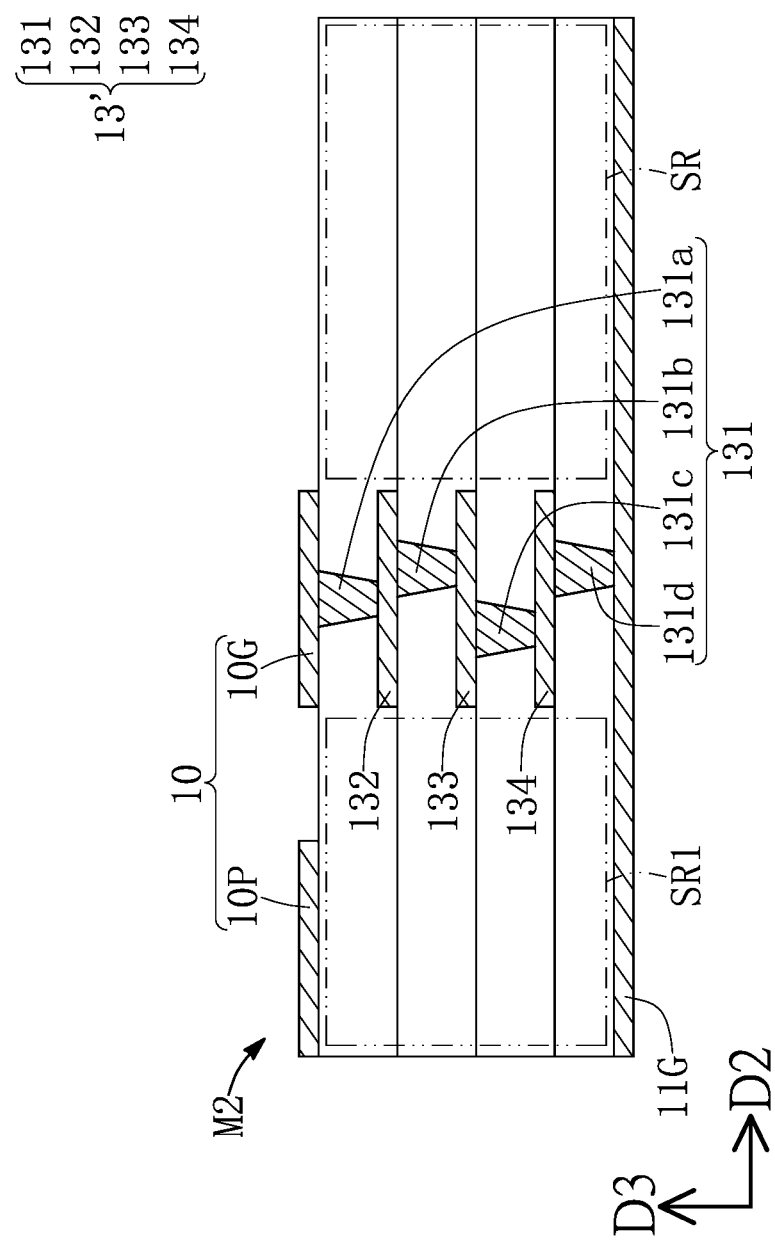
FIG. 8 is a cross-sectional view taken along line VIII-VIII of FIG. 6.

Reference is made to FIG. 6 to FIG. 8. FIG. 6 is a perspective schematic view showing a part of a laminated structure according to another embodiment of the present disclosure. FIG. 7 is a cross-sectional view taken along line VII-VII of FIG. 6. FIG. 8 is a cross-sectional view taken along line VIII-VIII of FIG. 6. The elements of the laminated structure M2 in the instant embodiment which are the same as or similar to those of the laminated structure M1 in the first embodiment are denoted by the same or similar reference numerals, and will not be reiterated herein.

A difference between the instant embodiment and the first embodiment is that the top power trace 10P is defined as the first top trace, and the top ground trace 10G is defined as the second top trace. Similarly, the bottom power trace 11P is defined as the first bottom trace, and the bottom ground trace 11G is defined as the second bottom trace.

That is to say, in the instant embodiment, the first conductive path 12' is connected between one of the top power traces 10P and one of the bottom power traces 11P. Reference is made to FIG. 6 and FIG. 7. The first upper conductive structure 121 of the first conductive path 12' is located under one of the top power traces 10P. Furthermore, the first connection wiring layer 122 of the first conductive path 12' extends from a position under one of the top power traces 10P to another position under one of the top ground traces 10G.

The first lower conductive structure 123 of the first conductive path 12' is not located under the top power trace 10P. To be more specific, the first lower conductive structure 123 is located under one of the top ground traces 10G. Accordingly, the first connection wiring layer 122 and one of the bottom power traces 11P jointly define a signal wire preselected region SR1 for arranging the signal interconnection traces, as shown in FIG. 7.

Reference is made to FIG. 6 and FIG. 8. The second conductive path 13' is connected between one of the top ground traces 10G and one of the bottom ground traces 11G. The second conductive path 13' includes a second conductive structure 131 and a plurality of second conductive vias 131a-131d. In one embodiment, the second conductive structure 131 is located under one of the top ground traces 10G. That is to say, in the instant embodiment, by arranging the first lower conductive structure 123 and the second conductive structure 131 to be located under one of the top ground traces 10G, the region for arranging the signal interconnection traces can also be enlarged.

Second Embodiment

Figure 9:
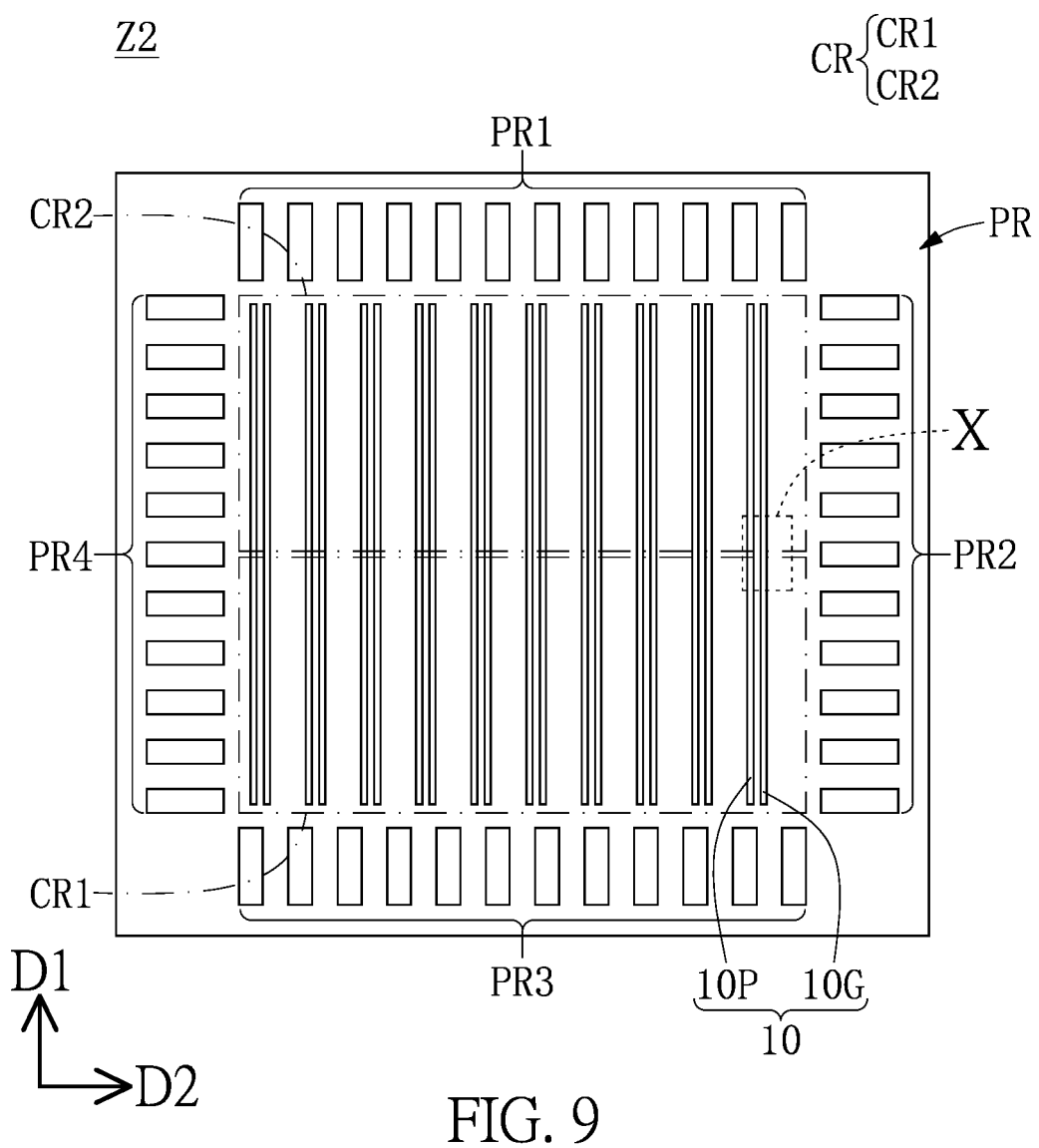
FIG. 9 is a top schematic view of an integrated circuit apparatus according to a second embodiment of the present disclosure.
Figure 10:
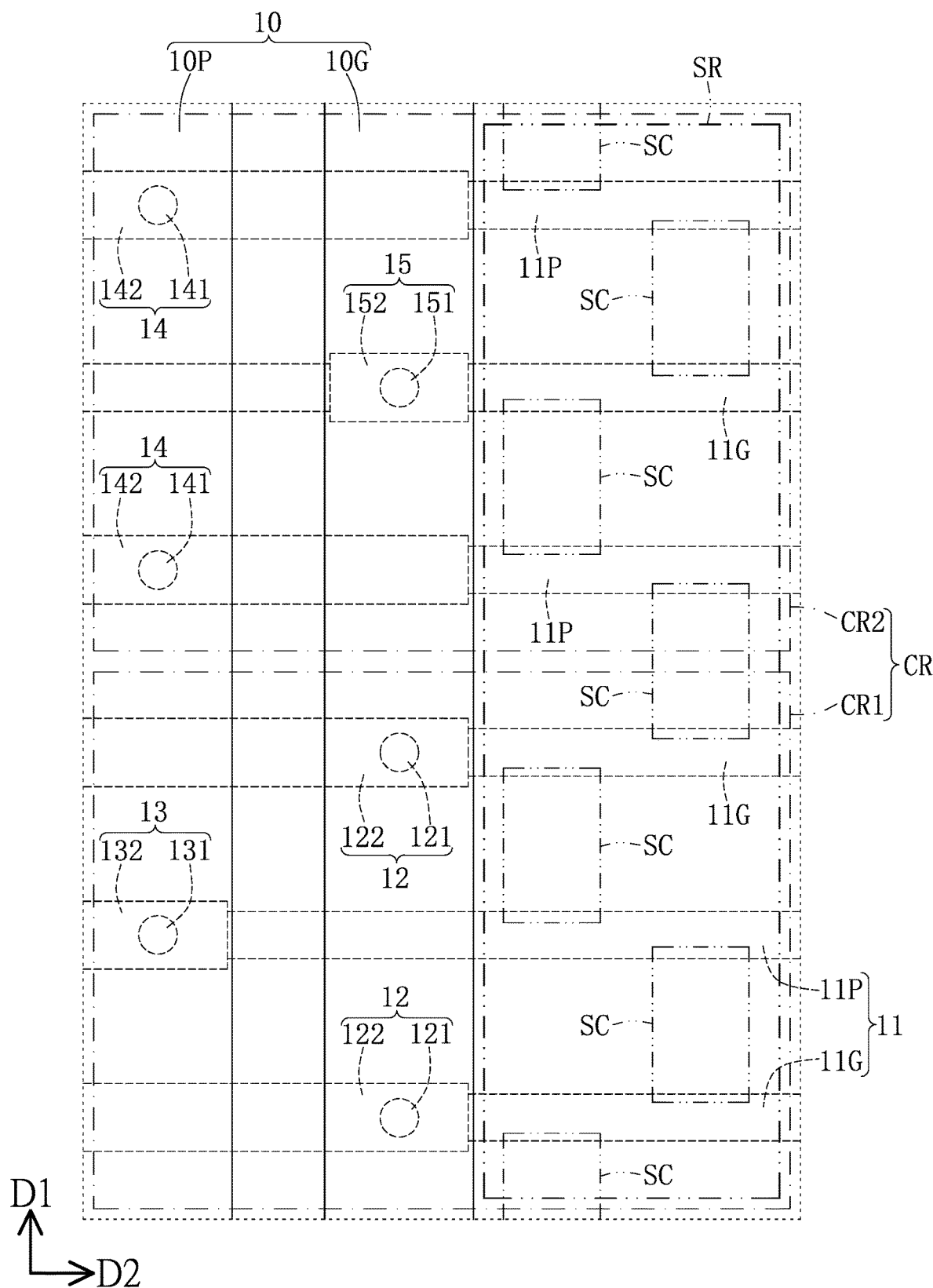
FIG. 10 is an enlarged view of part X shown in FIG. 9.

Reference is made FIG. 9 and FIG. 10, in which FIG. 9 is a top schematic view of an integrated circuit apparatus according to a second embodiment of the present disclosure, and FIG. 10 is an enlarged view of part X shown in FIG. 9. The elements of the integrated circuit apparatus Z2 in the instant embodiment which are similar to or the same as those of the integrated circuit apparatus Z1 are denoted by similar or the same reference numerals, and will not be reiterated herein.

As shown in FIG. 9, in the integrated circuit apparatus Z2 of the instant embodiment, the core region CR can be divided into at least a first sub-region CR1 and a second sub-region CR2. In the instant embodiment, the core region CR is divided along the second direction D2 into the first sub-region CR1 located at an upper part of the core region CR and a second sub-region CR2 located at a lower part of the core region CR. Accordingly, the first top traces and the second top traces extend from the first sub-region CR1 to the second sub-region CR2. In the instant embodiment, each one of the top ground traces 10G is defined as the first top trace, and each one of the top power traces 10P is defined as the second top trace. Furthermore, each one of the bottom ground traces 11G is defined as the first bottom trace, and each one of the bottom power traces 11P is defined as the second bottom trace.

Reference is made to FIG. 10. Each of the top ground traces 10G is electrically connected to the corresponding bottom ground trace 11G through the first conductive path 12. A detailed structure of the first conductive path 12 located in the first sub-region CR1 has been shown in FIG. 3 and FIG. 4. The first upper conductive structure 121 of the first conductive path 12 is located at a region between one of the top ground traces 10G and one of the bottom ground traces 11G and connected to the first connection wiring layer 122. Additionally, the first lower conductive structure 123 (as shown in FIG. 3) is located at a region between one of the top power traces 10P and one of the bottom ground traces 11G.

That is to say, the first lower conductive structures 123 located in the first sub-region CR1 are not located under any one of the top ground traces 10G. Specifically, in the first sub-region CR1, the first lower conductive structures 123 and the second conductive structures 131 are located under one of the top power traces 10P. As such, in the first sub-region CR1, the signal wire preselected region SR1 is located under the first connection wiring layer 122 and one of the top ground traces 10G (which can be observed in FIG. 4).

The power distribution network 1 can further include a third conductive path 14 and a fourth conductive path 15 in the second sub-region CR2. The third conductive path 14 is connected between one of the top power traces 10P (the second top traces) and one of the bottom power traces 11P (the second bottom traces). The third conductive path 14 has a structure that is similar to that of the first conductive path 12' shown in FIG. 7, i.e., the third conductive path 14 includes a third upper conductive structure 141, a third connection wiring layer 142, and a third lower conductive structure (not shown in figure). In one embodiment, the third lower conductive structure has the same functions and structure as those of the first lower conductive structure 123 illustrated in FIG. 7 and will be not reiterated herein.

As shown in FIG. 10, the third upper conductive structure 141 of the third conductive path 14 is located under one of the top power traces 10P and connected between one of the top power traces 10P and the third connection wiring layer 142. The third connection wiring layer 142 extends along the second direction D2 from a position under one of the top power traces 10P to another position under one of the top ground traces 10G. The third lower conductive structure is connected between the third connection wiring layer 142 and one of the bottom power traces 11P, but is not located under any one of the top power traces 10P.

The fourth conductive path 15 is connected between one of the top ground traces 10G (the first top trace) and one of the bottom ground traces 11G (the first bottom trace). The fourth conductive path 15 has a structure similar to that of the second conductive path 13' shown in FIG. 8. In the second sub-region CR2, the fourth conductive path 15 and the third lower conductive structure are jointly located under one of the top ground traces 10G (the first top traces).

Accordingly, the third upper conductive structure 141 and one of the bottom power traces 11P (the second bottom traces) can jointly define another signal wire preselected region SR1 therebetween. That is to say, in the instant embodiment, the signal wire preselected region SR1 in the first sub-region CR1 is located under one of the top ground traces 10G, and another signal wire preselected region SR1 in the second sub-region CR2 is located under one of the top power traces 10P.

In another embodiment, the core region CR can be divided along the first direction D1 into the first sub-region CR1 and the second sub-region CR2 respectively located at a left part and a right part of the core region CR. Accordingly, a number and a range of the sub-region is not limited in the present disclosure. In other embodiments, the core region CR may be divided into a plurality of sub-regions respectively having different areas and in different shapes from the top view. According to design requirements of the signal interconnection traces, the top ground traces 10G in different sub-regions can be electrically connected to the corresponding bottom ground traces 11G through either the first conductive path 12 or the fourth conductive path 15. Similarly, the top power traces 10P in different sub-regions can be electrically connected to the corresponding bottom power traces 11P through either the third conductive path 14 or the second conductive path 13.

When one of the top ground traces 10G is electrically connected to one of the bottom ground traces 11G through the first conductive path 12, and one of the top power traces 10P is electrically connected to one of the bottom power traces 11P through the second conductive path 13, the signal wire preselected region SR1 is located directly under the top ground trace 10G, which is illustrated in the top view of the first sub-region CR1, as shown in FIG. 10.

When one of the top ground traces 10G is electrically connected to one of the bottom ground traces 11G through the fourth conductive path 15, and one of the top power traces 10P is electrically connected to one of the bottom power traces 11P through the third conductive path 14, the signal wire preselected region SR1 is located directly under the top power trace 10P, which is illustrated in the top view of the second sub-region CR2, as shown in FIG. 10.

Beneficial Effects of the Embodiments

In conclusion, one of the advantages of the present disclosure is that in the integrated circuit apparatus Z1, Z2 provided herein, by "the first upper conductive structure 121 being located directly under the first top trace, the first lower conductive structure 123 being located directly under the second top trace, and the first upper conductive structure 121 and the first bottom trace jointly defining the signal wire preselected region SR1," the total range of the signal wire preselected regions SR, SR1 can be enlarged without decreasing the power integrity.

More specifically, the first conductive path 12, 12' further includes the first connection wiring layer 122. The first connection wiring layer 122 is located between the top wiring layer 10 and the bottom wiring layer 11, and extends from a position under the first top trace to another position under the second top trace, such that the first lower conductive structure 123 is arranged directly under the second top trace. As such, the total range covered by the signal wire preselected regions SR, SR1 can be enlarged, thereby improving the conveniences of design and fabrication for the signal interconnection traces.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An integrated circuit apparatus, comprising:
   a plurality of standard cells; and
   a power distribution network electrically connected to the standard cells and including:
   a top wiring layer including a first top trace and a second top trace that are adjacent to each other and extend along a first direction;
   a bottom wiring layer including a first bottom trace that extends along a second direction, wherein the first bottom trace has an electric potential that is equal to that of the first top trace but different from that of the second top trace; and
   a first conductive path connected between the first top trace and the first bottom trace and including a first upper conductive structure and a first lower conductive structure,
   wherein the first upper conductive structure is directly located under the first top trace, the first lower conductive structure is located directly under the second top trace, and the first upper conductive structure is not directly connected to the first bottom trace, such that the first upper conductive structure and the first bottom trace are able to jointly define a signal wire preselected region therebetween,
      wherein the first upper conductive structure is not located directly under the second top trace, and the first lower conductive structure is not located directly under the first top trace.

2. The integrated circuit apparatus according to claim 1, wherein the first conductive path further includes a first connection wiring layer disposed between the top wiring layer and the bottom wiring layer and extending along the second direction from a position under the first top trace to another position under the second top trace.

3. The integrated circuit apparatus according to claim 2, wherein the first upper conductive structure is connected between the first top trace and the first connection wiring layer, and the first lower conductive structure is connected between the first connection wiring layer and the first bottom trace, and wherein the signal wire preselected region is located below the first top trace and located between the first connection wiring layer and the first bottom trace.

4. The integrated circuit apparatus according to claim 1, wherein the bottom wiring layer further includes a second bottom trace arranged adjacent to the first bottom trace, and the second bottom trace has an electric potential equal to that of the second top trace, and wherein the power distribution network further includes a second conductive path, and the second top trace is electrically connected to the second bottom trace through the second conductive path.

5. The integrated circuit apparatus according to claim 4, wherein the second conductive path and the first lower conductive structure are both located under the second top trace.

6. The integrated circuit apparatus according to claim 4, wherein the integrated circuit apparatus has a core region, the power distribution network and the standard cells are located in the core region, and the core region is divided into a first sub-region and a second sub-region, and wherein the first top trace and the second top trace extend from the first sub-region to the second sub-region, and the first bottom trace, the second bottom trace, the first conductive path and the second conductive path are all located at the first sub-region.

7. The integrated circuit apparatus according to claim 6, wherein the bottom wiring layer further includes another first bottom trace and another second bottom trace that are located at the second sub-region, and wherein the power distribution network further includes a third conductive path located in the second sub-region, and the third conductive path includes:
   a third upper conductive structure located under and connected to the second top trace; and
   a third lower conductive structure connected to the another second bottom trace and located under the first top trace, wherein the third upper conductive structure and the second bottom trace jointly define another signal wire preselected region therebetween.

8. The integrated circuit apparatus according to claim 7, wherein the power distribution network further includes a fourth conductive path, the first top trace is electrically connected to the another first bottom trace through the fourth conductive path, and the fourth conductive path and the third lower conductive structure are jointly located under the first top trace.

9. The integrated circuit apparatus according to claim 1, wherein the first top trace is a top ground trace, the first bottom trace is a bottom ground trace, and the second top trace is a top power trace.

10. The integrated circuit apparatus according to claim 1, wherein the first top trace is a top power trace, the first bottom trace is a bottom power trace, and the second top trace is a top ground trace.

11. A power distribution network, comprising:
    a top wiring layer including a first top trace and a second top trace that are adjacent to each other and extend along a first direction;
    a bottom wiring layer including a first bottom trace that extends along a second direction, wherein the first bottom trace has an electric potential that is equal to as that of the first top trace but different from that of the second top trace; and
    a first conductive path connected between the first top trace and the first bottom trace and including a first upper conductive structure and a first lower conductive structure, wherein the first upper conductive structure is located directly under the first top trace, the first lower conductive structure is located directly under the second top trace, and the first upper conductive structure is not directly connected to the first bottom trace, such that the first upper conductive structure and the first bottom trace are able to jointly define a signal wire preselected region therebetween,
       wherein the first upper conductive structure is not located directly under the second top trace, and the first lower conductive structure is not located directly under the first top trace.

12. The power distribution network according to claim 11, wherein the first conductive path further includes a first connection wiring layer disposed between the top wiring layer and the bottom wiring layer and extending along the second direction from a position under the first top trace to another position under the second top trace.

13. The power distribution network according to claim 12, wherein the first upper conductive structure is connected between the first top trace and the first connection wiring layer, and the first lower conductive structure is connected between the first connection wiring layer and the first bottom trace, and wherein the signal wire preselected region is located below the first top trace and located between the first connection wiring layer and the first bottom trace.

14. The power distribution network according to claim 11, wherein the bottom wiring layer further includes a second bottom trace arranged adjacent to the first bottom trace, and the second bottom trace has an electric potential equal to that of the second top trace, and wherein the power distribution network further includes a second conductive path, and the second top trace is electrically connected to the second bottom trace through the second conductive path.

15. The power distribution network according to claim 14, wherein the second conductive path and the first lower conductive structure are both located under the second top trace.

16. The power distribution network according to claim 14, being arranged in a core region of an integrated circuit apparatus, and the core region being divided into a first sub-region and a second sub-region, wherein the first top trace and the second top trace extend from the first sub-region to the second sub-region, and the first bottom trace, the second bottom trace, the first conductive path and the second conductive path are all located at the first sub-region.

17. The power distribution network according to claim 16, wherein the bottom wiring layer further includes another first bottom trace and another second bottom trace that are located at the second sub-region, and wherein the power distribution network further comprises a third conductive path located in the second sub-region, and the third conductive path includes:
 a third upper conductive structure located under and connected to the second top trace; and
 a third lower conductive structure connected to the another second bottom trace and located under the first top trace, wherein the third upper conductive structure and the second bottom trace jointly define another signal wire preselected region therebetween.

18. The power distribution network according to claim 17, further comprising a fourth conductive path, wherein the first top trace is electrically connected to the another first bottom trace through the fourth conductive path, and the fourth conductive path and the third lower conductive structure are jointly located under the first top trace.

19. The power distribution network according to claim 11, wherein the first top trace is a top ground trace, the first bottom trace is a bottom ground trace, and the second top trace is a top power trace.

20. The power distribution network according to claim 11, wherein the first top trace is a top power trace, the first bottom trace is a bottom power trace, and the second top trace is a top ground trace.

* * * * *